(12) United States Patent
Tan et al.

(10) Patent No.: US 7,787,314 B2
(45) Date of Patent: Aug. 31, 2010

(54) DYNAMIC REAL-TIME DELAY CHARACTERIZATION AND CONFIGURATION

(75) Inventors: Jun Pin Tan, Kuala Lumpur (MY); Wei Yee Koay, Penang (MY); Boon Jin Ang, Penang (MY); Choong Kit Wong, Penang (MY); Guang Sheng Soh, Gemas (MY)

(73) Assignee: Altera Corporation, San Jose, CA (US)

( * ) Notice: Subject to any disclaimer, the term of this patent is extended or adjusted under 35 U.S.C. 154(b) by 159 days.

(21) Appl. No.: 12/208,967

(22) Filed: Sep. 11, 2008

(65) Prior Publication Data

US 2010/0061166 A1 Mar. 11, 2010

(51) Int. Cl.
*G11C 7/10* (2006.01)
(52) U.S. Cl. .................. 365/189.08; 365/194; 365/221; 365/225.7; 365/189.02
(58) Field of Classification Search ............ 365/189.08, 365/194, 221, 225.7, 189.02
See application file for complete search history.

(56) References Cited

U.S. PATENT DOCUMENTS

| 5,970,005 | A  | * | 10/1999 | Yin et al. ..................... 365/201 |
| 6,044,025 | A  | * | 3/2000  | Lawman ..................... 365/191 |
| 6,876,563 | B1 | * | 4/2005  | Manapat et al. ............... 365/63 |
| 7,548,471 | B2 | * | 6/2009  | Loeffler et al. ............... 365/194 |
| 7,583,103 | B2 | * | 9/2009  | Lewis et al. ................... 326/38 |
| 7,626,861 | B1 | * | 12/2009 | Lakkapragada et al. 365/185.08 |
| 2004/0017697 | A1 | * | 1/2004  | Matthews et al. ...... 365/189.07 |
| 2004/0233717 | A1 | * | 11/2004 | Morikawa et al. ...... 365/185.11 |
| 2006/0267661 | A1 |   | 11/2006 | Lim et al. .................... 327/295 |
| 2007/0104000 | A1 | * | 5/2007  | Lin et al. .................... 365/200 |

* cited by examiner

*Primary Examiner*—Tuan T. Nguyen
(74) *Attorney, Agent, or Firm*—Weaver Austin Villeneuve & Sampson LLP

(57) ABSTRACT

In mask programmable integrated circuit, such as a structured ASIC, a delay chain provides a delay that is set by a mask programmable switch. The delay chain receives an input to allow the delay mask programmed delay to be overridden using a JTAG controller. This allows testing of different delays. The input may also be provided by a fuse block, so that the fuse block can override the mask programmable switch, thus allowing a delay to be changes after mask programming.

18 Claims, 5 Drawing Sheets

DYNAMIC REAL-TIME DELAY CHARACTERIZATION AND CONFIGURATION

BACKGROUND OF THE INVENTION

1. Field of the Invention

The present invention relates to integrated circuit memories and particularly to characterization and configuration of such memories.

2. Description of Related Art

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term "structured ASIC" is used here to refer to such devices.

Structured ASICs are devices that have some predetermined circuit characteristics, but that are also customizable to some degree. For example, a structured ASIC may include a two-dimensional array of many relatively small logic elements (referred to herein as hybrid logic elements or HLEs). The basic circuitry of these HLEs is generally the same or substantially the same, and is provided by a subset of the masks that are used to make the structured ASIC. Accordingly, the masks in this subset can be always the same or substantially the same. The overall function(s) performed by an HLE can be customized to some extent by customizing one or more additional masks used to make a particular structured ASIC product. Similarly, connections to, from, and/or between HLEs can be customized by customizing additional masks used to make the product. Because the structured ASIC has the same basic circuitry, the task of designing it to perform particular tasks is greatly simplified, speeded up, increased in reliability, and reduced in cost. An entire ASIC does not have to be designed "from scratch." Instead, only the customizable masks have to be designed.

SUMMARY

A structured ASIC according to an example of the present invention includes a delay chain in each block of a memory. The delay chain is mask programmable so that it can be set to different delays for different requirements. In addition, the mask programmable delay chain setting may be overridden by a JTAG controller so that different delays may be tested, regardless of the mask programmed delay. Also, a fuse block is provided that connects to the delay chains in the memory. The fuse block can be written after mask programming, and can be used to store an optimum delay that overrides whatever delay is mask programmed. Thus, a delay may be set for testing purposes through a JTAG controller, and may also be set for end-use through fuses, both the JTAG controller and fuses overriding any delay set by mask programming. This provides additional flexibility after mask programming.

A mask programmable integrated circuit according to an example includes: a memory; a delay chain in the memory to provide a delay that determines read and/or write time for cells of the memory; a mask programmable switch that is configurable to specify the delay provided by the delay chain; and a controller that receives one or more signals from outside the integrated circuit and in response generates an instruction to specify the delay provided by the delay chain, the instruction overriding any delay specified by the mask programmable switch.

An integrated circuit memory in a mask programmable integrated circuit according to an example includes: a plurality of memory cells; a JTAG TAP controller; a fuse block; a mask programmable switch; a first multiplexer that has a first input from the JTAG controller, a second input from the fuse block, and an output selected from the first input or the second input; a second multiplexer that has a first input from the first multiplexer, a second input from the mask programmable switch, and an output selected from the first input or the second input; and a delay chain including a plurality of delay elements and a third multiplexer, the number of delay elements used in the delay chain determined by the third multiplexer according to the output of the second multiplexer, the number of delay elements used in the delay chain determining a period used for reading and/or writing the plurality of memory cells.

A method of configuring memory delay in an integrated circuit memory of a mask programmable integrated circuit according to an example includes: providing a first delay in the integrated circuit memory, the first delay specified by a mask programmable switch; and subsequently replacing the first delay in the integrated circuit by a second delay, the second delay specified by an input provided to the integrated circuit memory through a JTAG input.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF ILLUSTRATED EMBODIMENTS

The present invention will now be described in detail with reference to various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Figure 1:
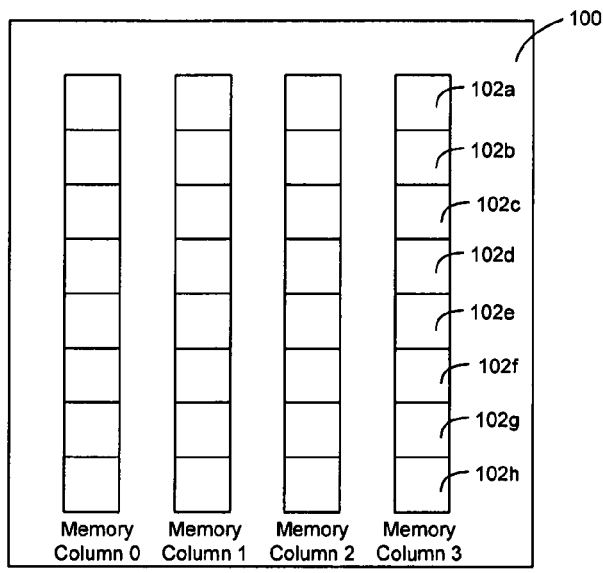
FIG. 1 shows a multi-block memory in a structured ASIC.

FIG. 1 shows a memory 100 in a mask programmable integrated circuit such as a structured ASIC. In the present example, memory 100 is a Static Random Access Memory (SRAM) used in a structured ASIC, such as a HardCopy® structured ASIC made by Altera®. Such a memory may be used as Random Access Memory (RAM) during operation of the structured ASIC. For example, such RAM may contain firmware used to operate the structured ASIC.

FIG. 1 shows memory 100 being formed of four columns (memory column 0-memory column 3), with each column containing multiple blocks. For example, memory column 3 consists of blocks 102a-102c. Other memories may contain different numbers of columns of blocks. Each block may also have an internal columnar structure, with memory cells laid out in a grid array of rows and columns. However, the columns of FIG. 1 refer to a higher level arrangement of blocks into columns, with blocks of a column sharing some peripheral circuits. It will be understood that the memory has a repetitive structure, with each column having the same arrangement of memory cells and peripheral circuits. Within each column, there are multiple blocks (eight per column in the example of FIG. 1). Blocks are generally identical to each other, with each block having an identical number of memory cells etc.

Figure 2:
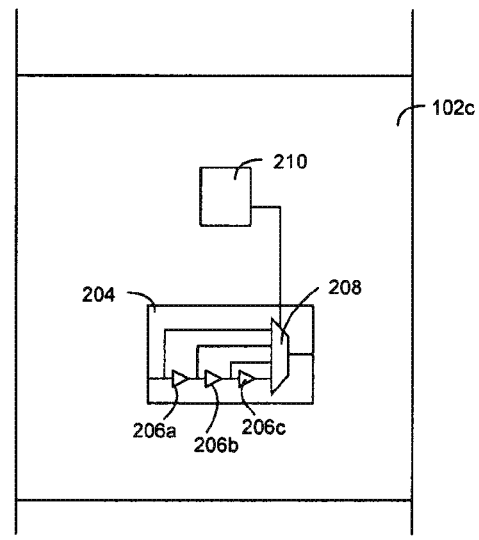
FIG. 2 shows a more detailed view of a block of the memory including an engineering delay chain and a mask programmable switch.

FIG. 2 shows a more detailed view of an individual block 102c of FIG. 1 showing some of the components of memory block 102c. In particular, FIG. 2 shows an engineering delay chain 204 that provides a predetermined time delay that is used in the operation of memory block 102c. Similar delay chains are provided in each block of memory array 100. Engineering delay chain 204 includes multiple delay stages 206a-206c that are connected in series so that the output of one delay stage is supplied as an input to a subsequent delay stage. For example, the output of delay stage 206a is provided as an input to delay stage 206b, and the output of delay stage 206b is provided as an input to delay stage 206c. While only three delay stages 206a-206c are shown in engineering delay chain 204, in other examples different numbers of delay stages (e.g. four or more) may be used. In addition to providing the output of each delay stage to the next delay stage in the series, each output is also provided to a multiplexer 208. Each delay stage 206a-206c provides some delay in an electrical signal. Thus, the outputs of the different delay stages 206a-206c provide the multiplexer 208 with signals that have a range of different delays. Multiplexer 208 then selects one of these delays as the appropriate delay to use for a particular memory operation.

Operations performed in memories include reading and writing. Selecting the right delay for such operations may be important to ensure acceptable operation of the memory. In particular, when reading memory cells, sense amplifiers (sense amps) may compare different voltages (e.g. bit line voltages) to determine the logical state of a cell. Such voltages change as bit lines discharge. So it is important that voltages are compared after a sufficient time delay to ensure that the voltages reflect the logical state of the cell. An engineering delay chain may be used to establish such a time delay. When writing (programming) memory cells, one or more voltages are applied to cause a change in the state of a memory cell. The duration of such programming voltages is generally important to ensure that cells are accurately programmed. Under programming can result in cells failing to change state successfully. The programming period that is used may be established by an engineering delay chain. Thus, an engineering delay chain provides a mechanism for recording a time delay in a memory block. The delay can then be used locally, in the memory block, without requiring communication with circuits outside the memory block every time the delay is used.

In the example of memory block 102c of FIG. 2, a mask programmable switch 210 is used to provide a select input to multiplexer 208 of the engineering delay chain 204. Thus, the mask programmable switch 210 determines how many of delay stages 206a-206c are used in the delay chain 204, and thereby determines the delay period used. Any suitable mask programmable switch may be used for this purpose. In general, mask programmable integrated circuits include hardwired components that are identical in all integrated circuits, and mask programmable components that are programmed by a manufacturer according to a customer's requirements and are not reconfigurable by the customer (i.e. they are not field programmable). The mask programmable switch 210 of FIG. 2 is set according to a customer's requirements based on the customer's particular application. Where the customer requires high performance, the delay may be relatively short to increase read and write speed. Where the customer has less stringent requirements, the delay may be relatively long.

Typically, a mask programmable switch, such as mask programmable switch 210 of FIG. 2, is set to a value that is determined to be an optimum value based either on simulation, or on characterization of the memory using a range of different settings. For example, a set of test chips may be prepared with mask programmable switches set to different delays. The chips are then tested to see which delay provides the best results (according to the customer's requirements). However, such testing may not always provide an accurate result. In particular, weak (slow to program or read) memory cells may be hidden in blocks with larger delay settings. Once a mask programmable switch is set, it is generally not possible to change the setting. Thus, if a customer finds that a mask programmed delay is set to a value that is not an optimum value; any integrated circuit made with the switch already set cannot be changed. A new production run may be needed, using a different mask programmed delay, with all the costs associated with such an additional production run.

According to an embodiment of the present invention, a mask programmable integrated circuit has an engineering delay that is configurable through mask programming and is also reconfigurable after mask programming, so that any delay set by mask programming can be overridden.

Figure 3:
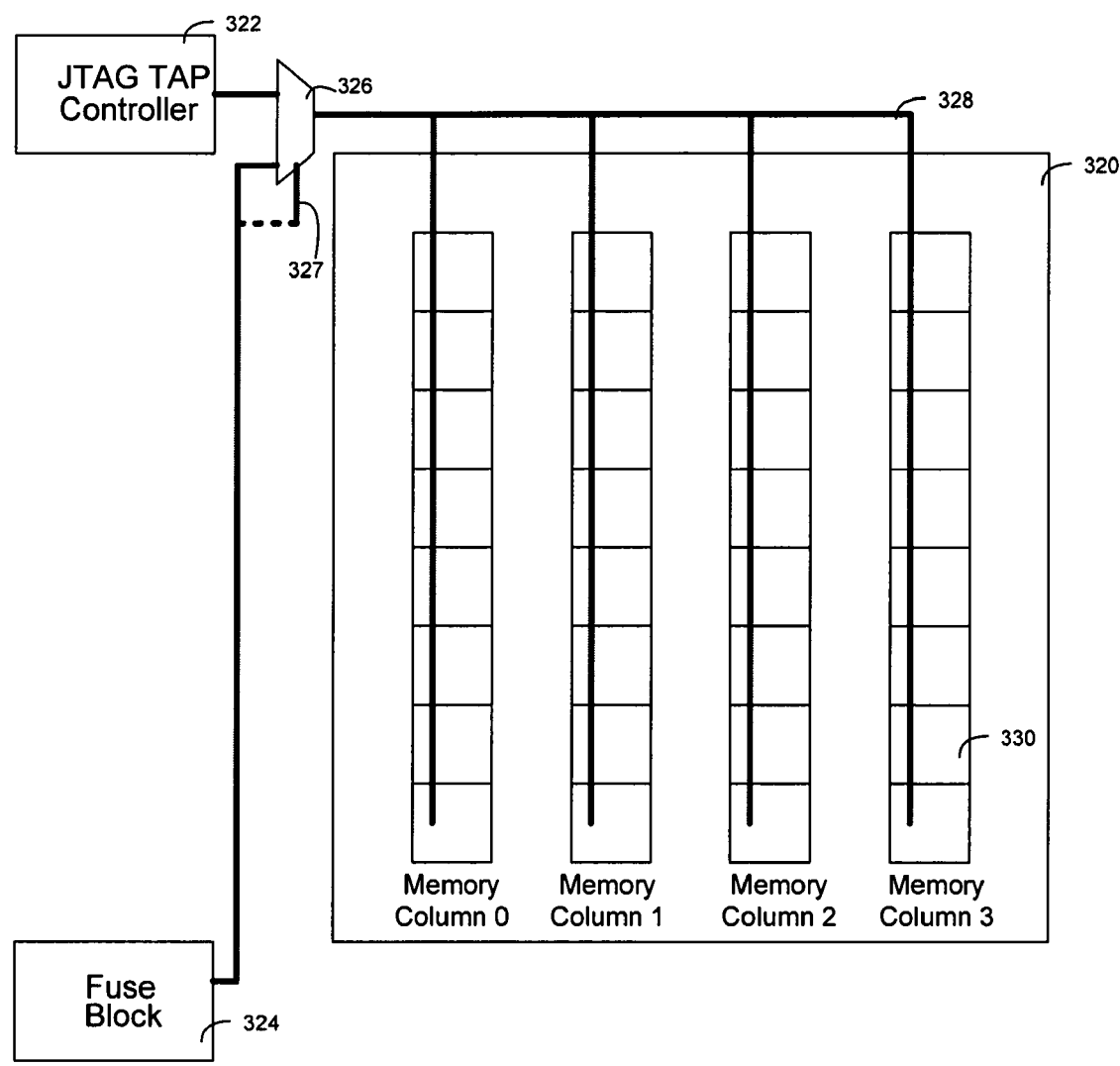
FIG. 3 shows a memory that includes a JTAG controller and a fuse block that are configurably connected to each block of the memory.

FIG. 3 shows a view of a memory 320 in a mask programmable integrated circuit according to an embodiment. In particular, memory 320 includes a delay chain in each block that is mask programmable as previously described. In addition, FIG. 3 shows a JTAG TAP controller 322 and a fuse block 324, each providing an input to a multiplexer 326 (JTAG multiplexer). Multiplexer 326 has a select input 327 so that determines which input is selected. Select input 327 may be provided by fuse block 324 as shown by the broken line in FIG. 3. Thus, a fuse in fuse block 324 may be used to select fuse block 324 as the output of multiplexer 326. In the default condition (where fuse block 324 is unmodified) JTAG TAP controller 322 is selected. In other examples, select input 327 may be provided in some other manner. The output 328 of JTAG multiplexer 326 is provided to each block of the memory 320 (for example, block 330 of column 2), so that each block of the memory receives the same input (from either JTAG TAP controller 322 or the fuse block 324). This input may be used to override a mask programmed delay in the memory blocks of memory 320.

JTAG TAP controller 322 may be any suitable controller. A JTAG (Joint Test Action Group) TAP (Test Access Port) controller is a well known component that is used for testing of an integrated circuit. Such a TAP controller is a connected to an access port, which can be connected to external test equipment. In response to signals received through such a port, the TAP controller performs boundary-scan testing, or other routines. Programming of certain portions of an integrated circuit may also be performed using such a port, through the TAP controller. In particular, a TAP controller may be connected to external equipment to configure the integrated circuit according to particular requirements.

Fuse block 324 (polyfuse block) is a portion of the mask programmable integrated circuit that contains one-time-programmable bits such as fuses (or antifuses). Such bits may be set after patterning of the integrated circuit is completed (i.e. after all circuits have been formed including setting of mask programmable switches). Fuse block 324 may contain polysilicon fuses or antifuses that can be burned at some time after the integrated circuit is manufactured. Other physical structures may also be used to store bits in a fuse block. Generally such fuses are configured at the manufacturer's facility and are not considered to be field programmable.

Figure 4:
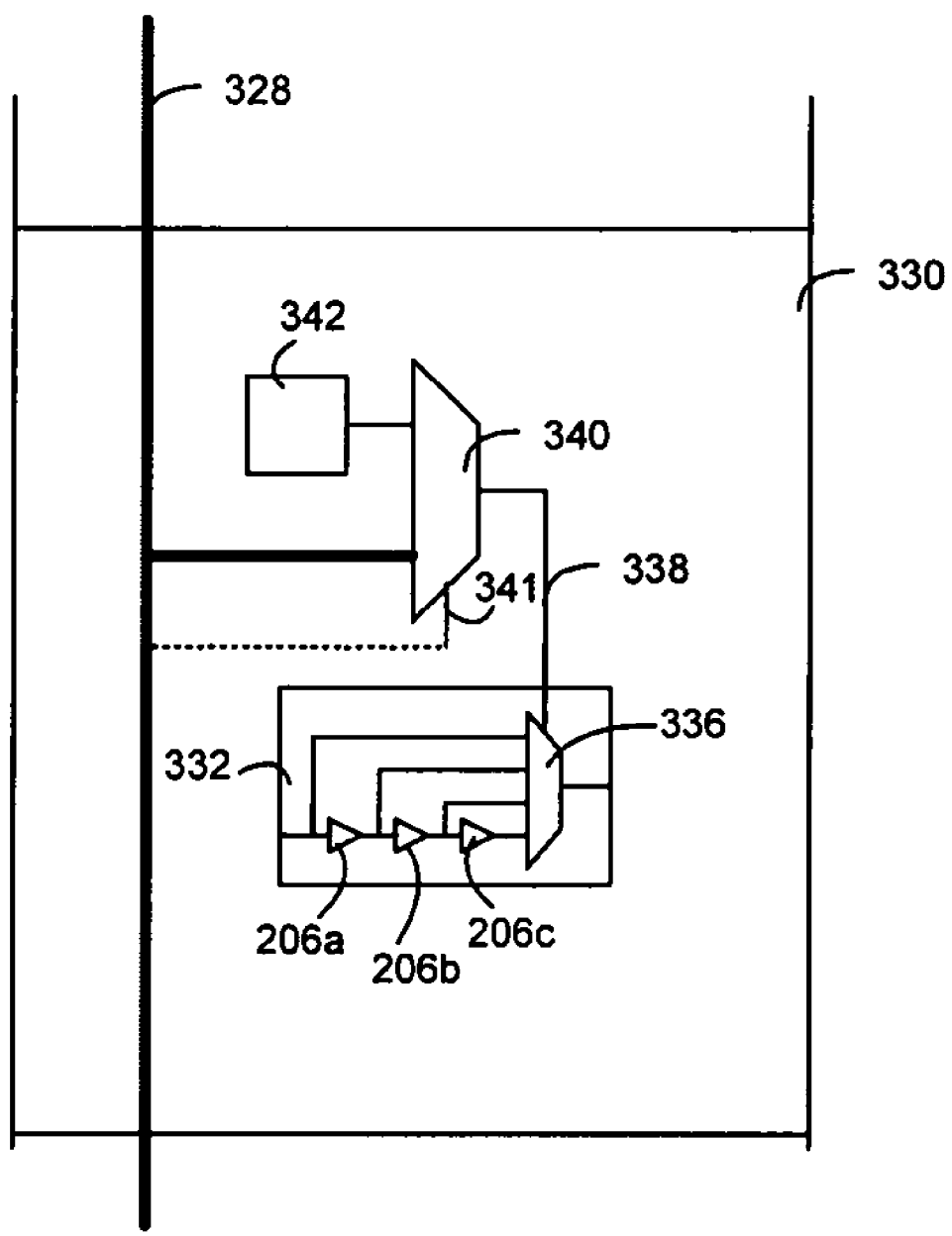
FIG. 4 shows how connections from the JTAG controller and fuse block are connected to an engineering delay chain in a block of the memory.

FIG. 4 shows a more detailed view of block 330 of memory 320 of FIG. 3. In particular, FIG. 4 shows an engineering delay chain 332 that performs the same functions as previously described and contains similar elements (delay stages 334a-334c and multiplexer 336). However, unlike the prior examples, here select input 338 to the delay chain multiplexer 336 is provided by another multiplexer 340. Multiplexer 340 has a mask programmable switch 342 providing one input so that delay chain 332 may be configured using the mask programmable switch as before. In addition multiplexer 340 has an input 328 from the JTAG multiplexer 326. Thus, multiplexer 340 allows the delay of engineering delay chain 332 to be configured through JTAG multiplexer 326, by either the JTAG TAP controller 332 or fuse block 324. Multiplexer 340 is controlled by select input 341. Multiplexer 340 may be configured so that its output comes from mask programmable switch 342 in a default mode, with its output coming from JTAG multiplexer 326 only when input 328 from JTAG multiplexer 326 is selected by multiplexer 340. Thus, in one example multiplexer input 341 may be controlled by a signal on input 328 as shown by the broken line from input 328 to select input 341. In other examples, select input 341 may be controlled by a different structure.

Providing the option of a different select signal to delay chain multiplexer 336 in this manner means that the delay of delay chain 332 may be configured after the integrated circuit is manufactured. This allows two important options. First, it allows a range of different delays to be easily tested, without separate mask programming steps. Thus, characterization of a particular configuration may be quickly and cheaply completed. Second, it allows a mask programmed delay to be replaced by a different value where the mask programmed delay is found to be unsatisfactory.

Figure 5:
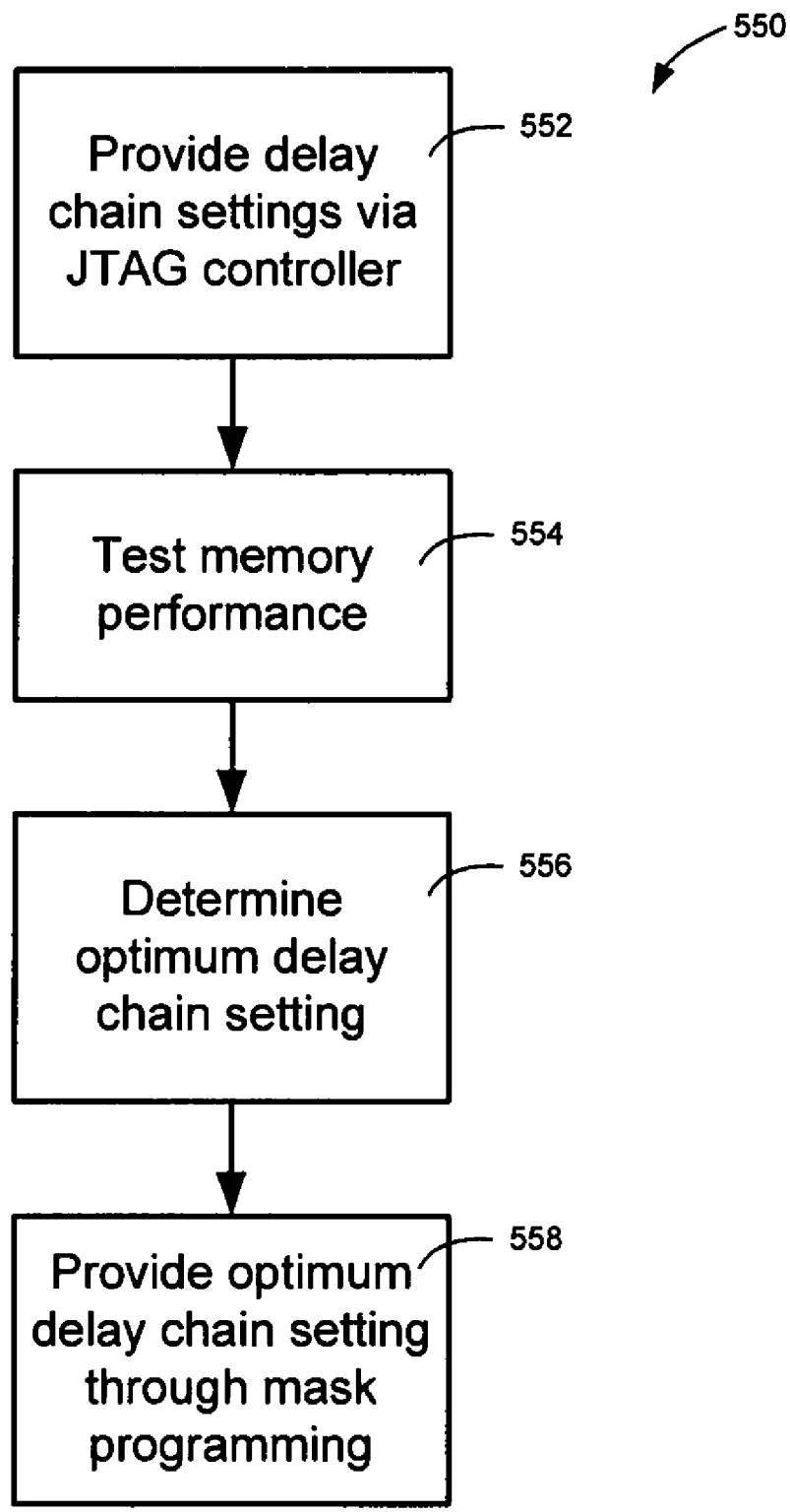
FIG. 5 shows a process for determining an optimum delay using different delays provided through a JTAG controller.

FIG. 5 shows a flowchart of a process 550 for characterizing different memory delays in a mask programmable integrated circuit. Delay chain settings (delay times) are provided 552 to each block of a memory from a JTAG controller. The delay chain settings may be based on some simulation or previous characterization. Generally a range of delays are provided in this manner and testing is performed for each delay. Testing memory performance 554 may involve writing data to the memory and reading the data from the memory to determine if any errors occur in the data. If the delay is too short, an increased number of errors may occur. If the delay is too long, the write speed or read speed may not meet a customer's requirements. From the range of delays tested, an optimum delay chain setting is determined 556. This optimum delay value may be based on several factors including speed, yield, and factors that are specific to a particular customer's needs. The optimum delay chain setting that is thus determined is then provided 558 through mask programming for any subsequent integrated circuits.

In general, when an optimum delay is obtained, this delay is then used for subsequently manufactured integrated circuits. Such a delay may be set by mask programming. Thus, after an initial test-lot (or test-lots) is made using some default mask programmed delay; a change is made to a mask so that subsequent lots have a different mask programmed delay, which corresponds to the optimum delay found from the test-lots. However, in some cases it may be desirable to change a delay in an integrated circuit after it is set by mask programming. For example, if testing provides a delay that is later found to be insufficient because of particular conditions or applications that were not fully accounted for during testing. Aspects of the present invention allow such a change in a delay after mask programming.

Figure 6:
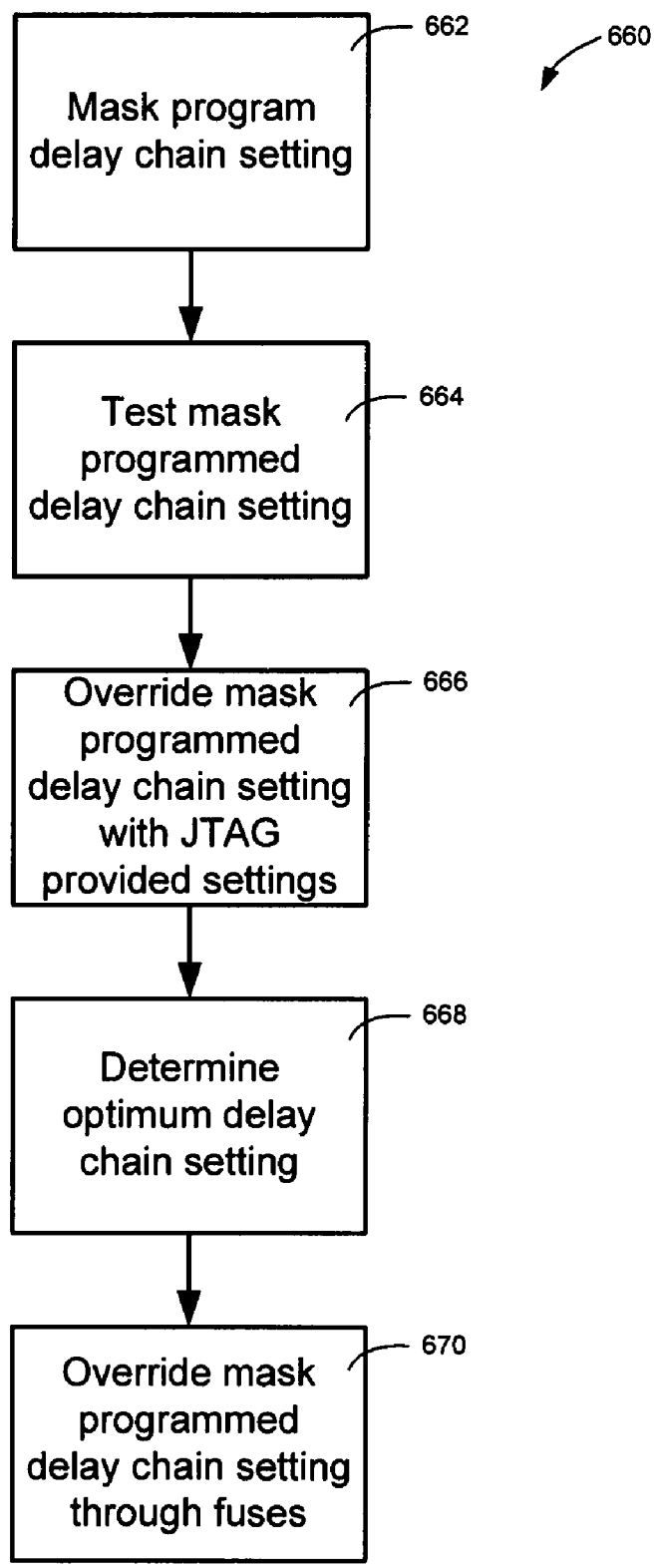
FIG. 6 shows a process for overriding a mask programmed delay using fuses.

FIG. 6 shows a process 660 that overrides a mask programmed delay in an integrated circuit. The delay chain is initially set 662 to a predetermined delay through mask programming. Then testing is performed 664 to determine if chips with the mask programmed delay perform satisfactorily. If they perform satisfactorily, no further modification is needed and the chips may be used. However, if testing of the mask programmed chips indicates that the delay used may be causing chips to fail (or otherwise indicates that the delay is unsatisfactory) then the chips may still be reset to a different delay. In this case, the JTAG controller is used to provide different delays 666 to the chips to override mask programmed delay chain settings and thus test different delay periods. An optimum delay is determined 668 from this testing as before. Then, fuses in the fuse block are configured to record the optimum delay and to provide this delay to the memory blocks and thus override 670 the mask programmed delay chain settings. In this way, the delays used by memory blocks may be changed after mask programming has already set the delays to a delay that is unsatisfactory.

While the invention has been particularly shown and described with reference to specific embodiments thereof, it will be understood by those skilled in the art that changes in the form and details of the disclosed embodiments may be made without departing from the spirit or scope of the invention. It is therefore intended that the invention be interpreted to include all variations and equivalents that fall within the true spirit and scope of the present invention.

What is claimed is:

1. A mask programmable integrated circuit comprising:
   a memory;
   a delay chain in the memory to provide a delay that determines read and/or write time for cells of the memory;
   a mask programmable switch that is configurable to specify the delay provided by the delay chain; and
   a controller that receives one or more signals from outside the integrated circuit and in response generates an instruction to specify the delay provided by the delay chain, the instruction overriding any delay specified by the mask programmable switch.

2. The mask programmable integrated circuit of claim 1 wherein the controller is a JTAG TAP controller.

3. The mask programmable integrated circuit of claim 1 wherein the controller receives a series of signals from outside the integrated circuit and in response specifies a series of delays that are used to characterize the integrated circuit.

4. The mask programmable integrated circuit of claim 1 wherein the memory is a Static Random Access Memory and the mask programmable integrated circuit is a structured Application Specific Integrated Circuit.

5. The mask programmable integrated circuit of claim 1 further comprising a set of one-time-programmable bits that are configurable to specify the delay provided by the delay chain and to override any delay specified by the mask programmable switch.

6. The mask programmable integrated circuit of claim 5 wherein the set of one-time-programmable bits are polysilicon fuses or antifuses.

7. An integrated circuit memory in a mask programmable integrated circuit comprising:
   a plurality of memory cells;
   a controller;
   a fuse block;
   a mask programmable switch;
   a first multiplexer that has a first input from the controller, a second input from the fuse block, and an output selected from the first input or the second input of the first multiplexer;
   a second multiplexer that has a first input from the first multiplexer, a second input from the mask programmable switch, and an output selected from the first input or the second input of the second multiplexer; and
   a delay chain including a plurality of delay elements and a third multiplexer, the number of delay elements used in the delay chain determined by the third multiplexer according to the output of the second multiplexer, the number of delay elements used in the delay chain determining a period used for reading and/or writing the plurality of memory cells.

8. The integrated circuit memory of claim 7 wherein the plurality of memory cells are configured as blocks, with each block having a delay chain and further comprising a line that extends from the first multiplexer to each block so that the delay for each block may be programmed from the controller or from the fuse block.

9. The integrated circuit memory of claim 7 wherein the fuse block consists of a plurality of fuses or antifuses that are one-time-programmable with a value that determines the number of delay elements used in the delay chain.

10. The integrated circuit memory of claim 7 wherein the plurality of memory cells are Static Random Access Memory (SRAM) cells.

11. The integrated circuit memory of claim 7 wherein the controller is a JTAG TAP controller.

12. A method of configuring memory delay in an integrated circuit memory of a mask programmable integrated circuit comprising:
    providing a first delay in the integrated circuit memory, the first delay specified by a mask programmable switch; and
    subsequently replacing the first delay in the integrated circuit by a second delay, the second delay specified by an input provided to the integrated circuit memory.

13. The method of claim 12 wherein the second delay is one of a plurality of delays provided to the integrate circuit memory that are used to characterize the integrated circuit memory.

14. The method of claim 13 wherein the characterization of the integrated circuit memory gives a third delay, the third delay providing optimized integrate circuit memory performance.

15. The method of claim 14 further comprising programming the third delay to a one-time programmable memory to replace the first delay in subsequent operation of the integrated circuit memory.

16. The method of claim 12 wherein the integrated circuit memory is a Static Random Access Memory.

17. The method of claim 12 wherein the first delay is stored in each block of the integrated circuit memory.

18. The method of claim 12 wherein providing the first delay in the integrated circuit includes providing a select input to a multiplexer to determine a number of delay stages that are used in a delay chain.

* * * * *